(12) United States Patent
Yoshihara et al.

(10) Patent No.: US 9,383,660 B2
(45) Date of Patent: Jul. 5, 2016

(54) EXPOSURE APPARATUS AND METHOD OF MANUFACTURING DEVICE

(75) Inventors: Toshiyuki Yoshihara, Utsunomiya (JP); Kazuhiro Tadokoro, Kyoto (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 937 days.

(21) Appl. No.: 13/464,114

(22) Filed: May 4, 2012

(65) Prior Publication Data

US 2012/0293781 A1    Nov. 22, 2012

(30) Foreign Application Priority Data

May 20, 2011  (JP) .................................. 2011-114106

(51) Int. Cl.
*G03B 27/52*    (2006.01)
*G03F 7/20*    (2006.01)

(52) U.S. Cl.
CPC ............ *G03F 7/70883* (2013.01); *G03F 7/705* (2013.01)

(58) Field of Classification Search
CPC .............................. G03F 7/705; G03F 7/70883
USPC ....................................... 355/30, 52
See application file for complete search history.

(56) References Cited

U.S. PATENT DOCUMENTS

| | | | | |
|---|---|---|---|---|
| 5,581,324 A * | 12/1996 | Miyai | .................. | G03F 7/70258 355/53 |
| 5,883,704 A * | 3/1999 | Nishi | ..................... | G03B 27/26 355/30 |
| 6,235,438 B1 * | 5/2001 | Suzuki | .................... | G03F 7/701 430/30 |
| 6,711,531 B1 * | 3/2004 | Tanaka | ..................... | G06G 7/66 700/31 |
| 7,151,588 B2 | 12/2006 | Franken et al. | | |
| 2003/0099269 A1 * | 5/2003 | Ershov | ................ | G03F 7/70025 372/55 |
| 2005/0140950 A1 * | 6/2005 | Franken et al. | ................. | 355/53 |
| 2006/0072097 A1 * | 4/2006 | Zach | ...................... | G03B 27/72 355/69 |
| 2010/0141913 A1 | 6/2010 | Morimoto | | |
| 2013/0182232 A1 | 7/2013 | Hirukawa | | |
| 2013/0195141 A1 * | 8/2013 | Koudo | ...................... | G01K 7/42 374/170 |
| 2016/0047714 A1 * | 2/2016 | Fujii | ..................... | F16H 61/061 73/115.04 |

FOREIGN PATENT DOCUMENTS

JP    52061686 A    5/1977
JP    0619504 A    1/1994

(Continued)

OTHER PUBLICATIONS

Official Action issued in JP2011-114106 mailed Jan. 5, 2015.

*Primary Examiner* — Deoram Persaud
(74) *Attorney, Agent, or Firm* — Rossi, Kimms & McDowell LLP

(57) ABSTRACT

An exposure apparatus which includes a projection optical system and exposes a substrate to radiant energy via the projection optical system, includes a temperature measuring device configured to perform measurement of a temperature of a temperature measurement portion of the projection optical system, and a controller configured to perform prediction of a change in an optical characteristic of the projection optical system based on a change in temperature measured by the temperature measuring device, and to perform processing of reduction, based on the prediction, of a change in a state of an image formed on the substrate by the projection optical system, wherein the controller is configured to perform the prediction in accordance with a second-order lag response function to the change in temperature of the temperature measurement portion.

14 Claims, 6 Drawing Sheets

(56) References Cited

FOREIGN PATENT DOCUMENTS

| | | |
|---|---|---|
| JP | 2003059807 A | 2/2003 |
| JP | 2005101593 A | 4/2005 |
| JP | 2005203522 A | 7/2005 |
| JP | 2005303042 A | 10/2005 |
| JP | 2006041094 A | 2/2006 |
| JP | 2010161344 A | 7/2010 |
| JP | 2010171175 A | 8/2010 |
| JP | 2010199615 A | 9/2010 |

* cited by examiner

F I G. 1
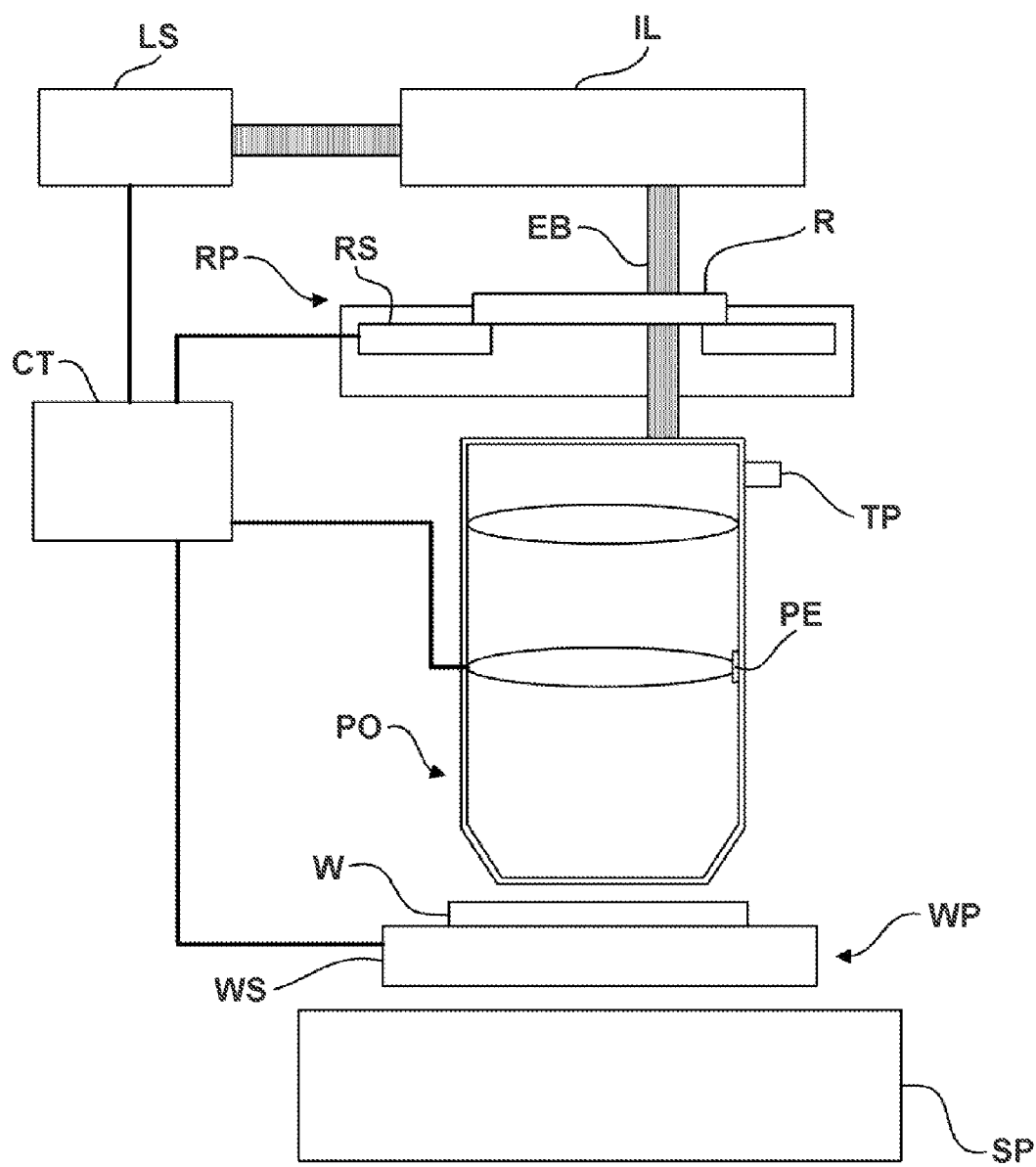

EXPOSURE APPARATUS AND METHOD OF MANUFACTURING DEVICE

BACKGROUND OF THE INVENTION

1. Field of the Invention

The present invention relates to an exposure apparatus, and a method of manufacturing a device.

2. Description of the Related Art

With an improvement in packing density of elements in devices such as a semiconductor device, an exposure apparatus used to manufacture a device is required to transfer a finer pattern to a precise position on a substrate at a precise size. To transfer a pattern onto the substrate at a precise size, it is necessary to improve the focus accuracy of matching the imaging plane (focal plane) of a projection optical system with the substrate surface. Also, to form a pattern image at a precise position on the substrate, it is of prime importance to maintain the projection magnification of the projection optical system at a target magnification.

The optical characteristics of a projection optical system, such as its imaging plane position (focus position) and projection magnification, can be adjusted to optimum states before an exposure apparatus is used. However, the optical characteristic of the projection optical system may change due to various factors. One of the factors which change the optical characteristic of the projection optical system is a change in temperature of the projection optical system due to heat from the exterior of the projection optical system. The temperature of the projection optical system may change due to factors other than those associated with exposure energy. The factors of a change in temperature of the projection optical system include, for example, a temperature control error of a thermostatic chamber in the exposure apparatus, and heat generated by a motor which drives a stage.

Japanese Patent Laid-Open No. 2005-203522 discloses a method of controlling the temperature of the outer surface of a barrel of a projection optical system to stabilize the temperature of the projection optical system. Japanese Patent Laid-Open No. 2003-59807 discloses a method of predicting a change in optical characteristic using a power polynomial model for the temperature measurement value at a specific position in an exposure apparatus, and correcting the change in optical characteristic.

As described above, to transfer a fine pattern onto the substrate, it is of prime importance to suppress a change in temperature of the exterior of the projection optical system, or to predict and appropriately correct the influence of a change in temperature of the exterior of the projection optical system. Heat generated in the exposure apparatus may be transferred to the projection optical system upon heat conduction, convection, or thermal radiation between members that constitute the exposure apparatus, and change the temperature of the projection optical system. Therefore, a change in temperature of a temperature measurement portion does not always immediately change the optical characteristic of the projection optical system, and a change in optical characteristic of the projection optical system generally appears with a predetermined time lag from the change in temperature. The methods of correcting the optical characteristic in the related art techniques often cannot correct the optical characteristic with a sufficient accuracy due to this time lag.

SUMMARY OF THE INVENTION

The present invention provides, for example, a technique advantageous in accurate prediction of a change in an optical characteristic of a projection optical system due to a change in temperature of the projection optical system, and reduction of influence thereof.

One of the aspects of the present invention provides an exposure apparatus which includes a projection optical system and exposes a substrate to radiant energy via the projection optical system, the apparatus comprising: a temperature measuring device configured to perform measurement of a temperature of a temperature measurement portion of the projection optical system; and a controller configured to perform prediction of a change in an optical characteristic of the projection optical system based on a change in temperature measured by the temperature measuring device, and to perform processing of reduction, based on the prediction, of a change in a state of an image formed on the substrate by the projection optical system, wherein the controller is configured to perform the prediction in accordance with a second-order lag response function to the change in temperature of the temperature measurement portion.

Further features of the present invention will become apparent from the following description of exemplary embodiments with reference to the attached drawings.

BRIEF DESCRIPTION OF THE DRAWINGS

FIG. 1 is a diagram showing an exposure apparatus according to the first embodiment of the present invention;

DESCRIPTION OF THE EMBODIMENTS

Figure 2A:
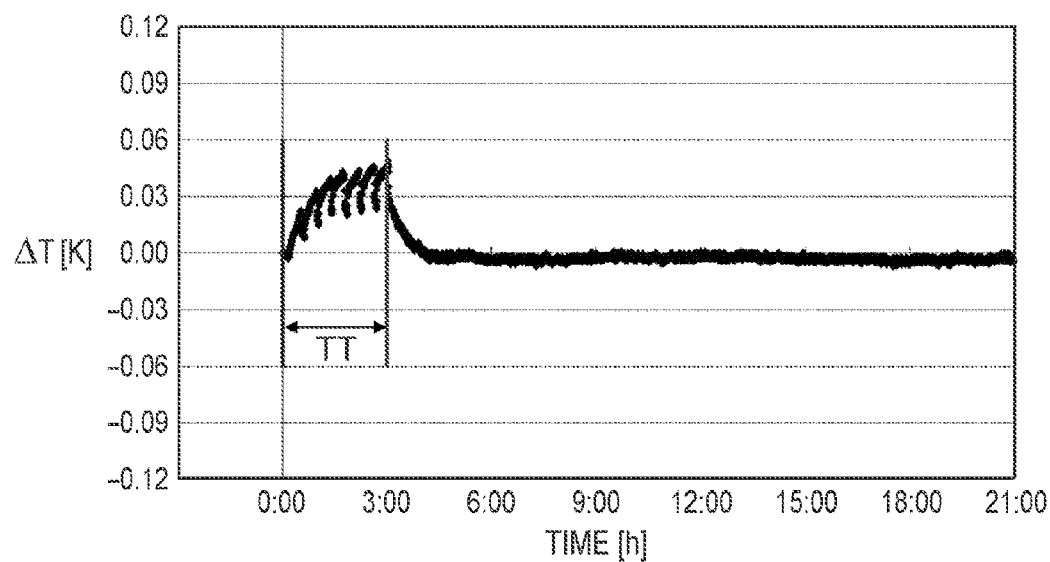
FIGS. 2A and 2B are graphs illustrating a change in temperature and that in projection magnification of a projection optical system.

Some embodiments of the present invention will be described below with reference to the accompanying drawings. In the following description, the concept of an optical characteristic can include, for example, focus, magnification, distortion, curvature of field, astigmatism, spherical aberration, and coma aberration. Each of focus, magnification, distortion, curvature of field, astigmatism, spherical aberration, and coma aberration can be construed as one of aberrations. Each of focus, curvature of field, astigmatism, spherical aberration, and coma aberration can also be regarded as the wavefront aberration of a projection optical system. The wavefront aberration can be expressed as each coefficient obtained when the phase distribution on the pupil plane of the projection optical system is expanded using Zernike polynomials.

An exposure apparatus 100 according to the first embodiment of the present invention will be described with reference to FIG. 1. The exposure apparatus 100 can include a light source LS, illumination optical system IL, original positioning mechanism RP, projection optical system PO, substrate positioning mechanism WP, stage base SP, controller CT, and thermometer (temperature measuring device) TP. The light source LS can be, for example, an ultraviolet laser light source filled with a gas such as KrF or ArF.

A light beam emitted by the light source LS is converted into a light beam EB having a desired illuminance distribution and coherence factor in the illumination optical system IL, and strikes an original R. A circuit pattern to be transferred onto a substrate W is formed on the original R. The original positioning mechanism RP uses a driving mechanism (not shown) to drive an original stage RS including an original chuck which holds the original R, thereby positioning the original R. When the exposure apparatus 100 serves as a scanning exposure apparatus, the original positioning mechanism RP scans (moves) the original stage RS, which holds the original R, at a predetermined speed during exposure on the substrate W.

The projection optical system PO reduces and projects the circuit pattern, formed on the original R to each shot region on the substrate W coated with a photoresist, at a reduction magnification β (for example, β=−¼) to form an image of the circuit pattern in this shot region. Note that when the reduction magnification β has a negative sign, the image of the circuit pattern projected onto the substrate W is an inverted image.

The substrate positioning mechanism WP is arranged on the stage base SP. The substrate positioning mechanism WP uses a driving mechanism (not shown) to drive a substrate stage WS including a substrate chuck which holds the substrate W, thereby positioning the substrate W. The substrate stage WS can be driven in three-dimensional directions, that is, in the optical axis direction of the projection optical system PO and two directions perpendicular to this optical axis direction. When the exposure apparatus 100 serves as a scanning exposure apparatus, the substrate stage WS is scanned (moved) in synchronism with the original stage RS at a speed β times the scanning speed of the original stage RS during exposure on the substrate W. The positions of the original stage RS and substrate stage WS are detected by position detection devices (for example, laser interferometers; not shown). The controller CT controls the light source LS, the original positioning mechanism RP, the substrate positioning mechanism WP, and a correction unit PE built into the projection optical system PO. The temperature measuring device TP includes a thermometer which measures the temperature of a temperature measurement portion of the projection optical system PO, and measures the temperature of the temperature measurement portion of the projection optical system PO. The temperature measurement portion can be, for example, part of the exterior of the barrel of the projection optical system PO.

A method of predicting a change in magnification error of the projection optical system PO based on the temperature measured by the temperature measuring device TP will be described below. The magnification error to be described hereinafter means an error (difference) of an actual projection magnification with respect to (from) the target reduction magnification β.

FIG. 2A illustrates a change in temperature of the temperature measurement portion of the projection optical system PO measured by the temperature measuring device TP. FIG. 2A shows time on the abscissa and the change in temperature on the ordinate. In a time interval TT shown in FIG. 2A, the original stage RS is driven while light is not emitted by the light source LS toward the projection optical system PO. In an interval before the start of the time interval TT, the exposure apparatus 100 is kept stopped for a sufficiently long time, so its temperature is stable at a steady state value (that is, its temperature is in equilibrium). The change in temperature shown in FIG. 2A results from heat generated by constituent components of the exposure apparatus 100 and, especially, the original positioning mechanism RP.

Figure 2B:
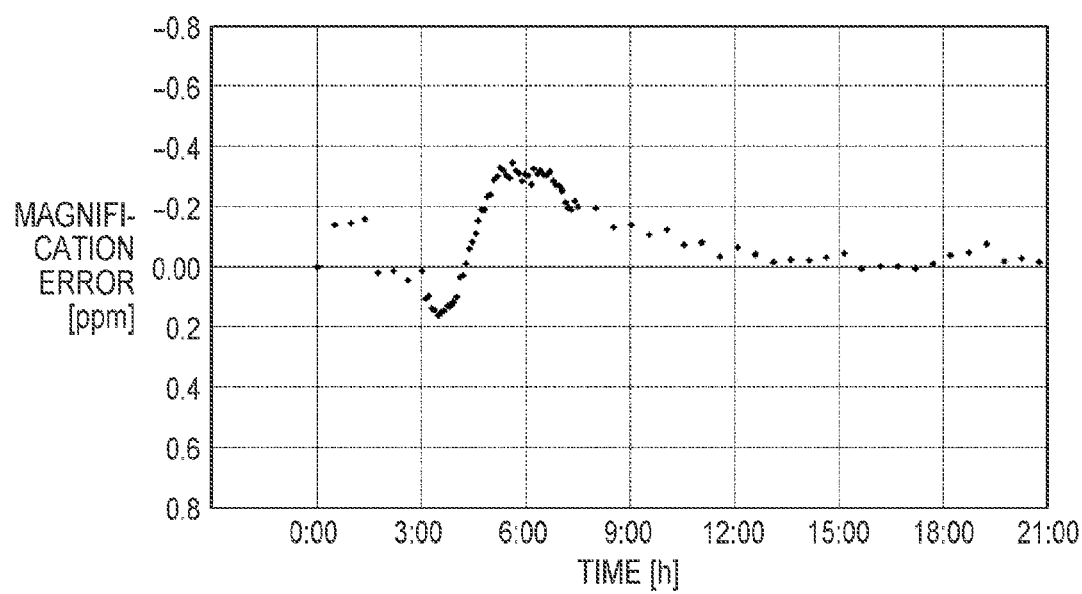
Figure 3:
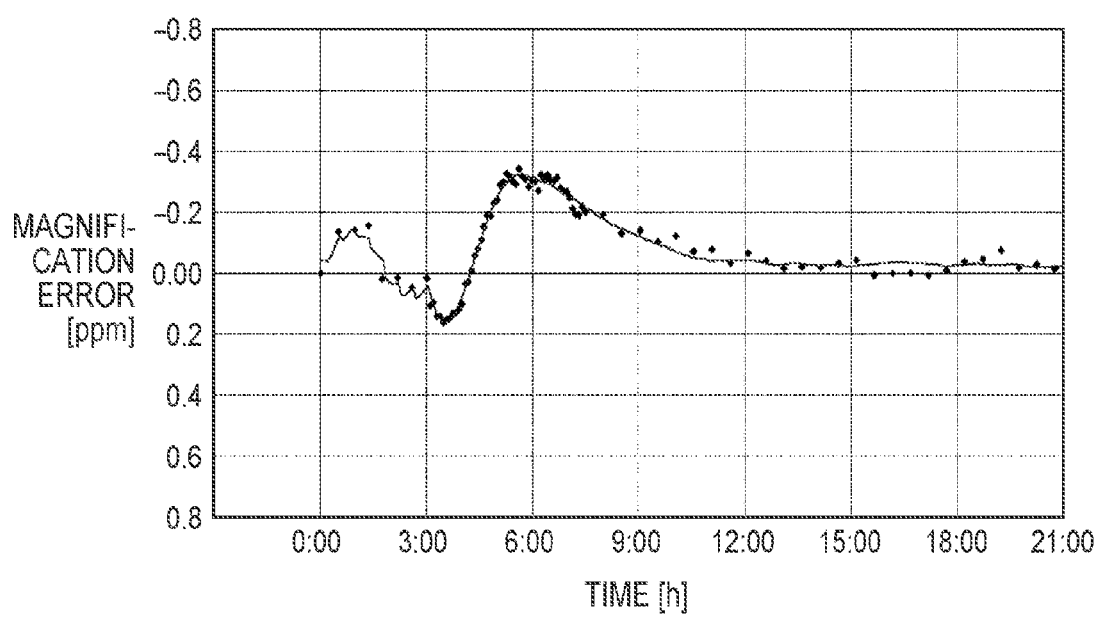
FIG. 3 is a graph illustrating the measurement value and prediction value of the projection magnification of the projection optical system.

FIG. 2B illustrates a change in magnification error of the projection optical system PO on the same time axis as in FIG. 2A. Each point in FIG. 2B indicates the measurement value of the magnification error of the projection optical system PO. FIG. 3 illustrates, using a solid line, the prediction value of the magnification error of the projection optical system PO obtained by prediction using the following method based on the measurement result of the temperature illustrated in FIG. 2A. Note that each point shown in FIG. 3 is the same as that shown in FIG. 2B.

Let $\phi(t)$ be the magnification error of the projection optical system PO at time t, and $T(t)$ be the measurement value of the temperature of the projection optical system PO obtained by the temperature measuring device TP at time t. First, after the exposure apparatus 100 is kept stopped for a sufficiently long time, it is confirmed that the measurement value obtained by the temperature measuring device TP has a constant value. A measurement value $T(t_0)$ obtained by the temperature measuring device TP at time $t_0$ is defined as T0. Also, a change in temperature $\Delta T(t)$ is defined as:

$$\Delta T(t) = T(t) - T0 \tag{1}$$

As an example, the following description assumes that the temperature measurement portion measured by the temperature measuring device TP is part of the outer surface of the barrel of the projection optical system PO.

At time $t_0$, the magnification of the projection optical system PO is not influenced by a change in temperature of other constituent components (for example, the original positioning mechanism RP) of the exposure apparatus 100, and is therefore satisfactorily adjusted. Hence, a magnification error $\phi(t)$ of the projection optical system PO at time $t_0$ is defined as:

$$\phi(t_0) = 0 \tag{2}$$

A prediction model equation describing a change in magnification error $\phi(t)$ of the projection optical system PO with a change in temperature of the barrel of the projection optical system PO will be described next. This prediction model equation is given by a second-order lag response function, as will be described hereinafter. The causes of a change in magnification error of the projection optical system PO include, for example, a change in refractive index of optical elements which constitute the projection optical system PO due to a change in temperature of the optical elements, thermal expansion of the optical elements, and a change in distance between the optical elements due to thermal expansion of the barrel which holds the optical elements.

Heat generated by the original positioning mechanism RP is transferred to the outer surface of the barrel of the projection optical system PO (the temperature of part of that outer surface is to be measured by the temperature measuring device TP in this example) first. The generated heat is further transferred to the optical elements of the projection optical system PO and portions which support them due to heat conduction, convection, or thermal radiation, leading to a change in magnification error $\phi(t)$. For example, the exterior of the barrel of the projection optical system PO may be heated by heat generated by the original positioning mechanism RP, thus generating a temperature gradient in the projection optical system PO. The heat is transferred to the optical elements inside the projection optical system PO due to that temperature gradient. Such heat transfer can be analyzed by a second-order lag transfer model equation. Assume, for example, an input described by:

$$X(s) = \frac{1}{s} \quad (3a)$$

A transfer function G(s) and response characteristics Y(s) of a second-order lag transfer model can be described by:

$$G(s) = \frac{K}{(1+\tau_1 s)\cdot(1+\tau_2 s)} \quad (3b)$$

$$Y(s) = \frac{K}{(1+\tau_1 s)\cdot(1+\tau_2 s)} \cdot \frac{1}{s} \quad (3c)$$

Given a measurement value φ(t−Δt) of the magnification error at time (t−Δt) (Δt is a positive value), and information of the change in temperature ΔT(t) at time t, the above-mentioned second-order lag transfer model equation can be used to obtain the measurement value φ(t) of the magnification error at time t, based on a second-order lag response function given by:

$$\phi(t) = \sum_{i=1}^{N} (\phi_{i,1}(t) + \phi_{i,2}(t)) \quad (4)$$

where $\phi_{i,1}(t)$ and $\phi_{i,2}(t)$ are recurrence relations given by:

$$\phi_{i,1}(t) = \phi_{i,1}(t-\Delta t)\cdot \exp\left(-\frac{\Delta t}{\tau_{i,1}+\tau_{i,2}}\right) + \alpha_i \cdot \Delta T(t) \cdot \frac{\tau_{i,1}+\tau_{i,2}}{\tau_{i,1}}\left\{1-\exp\left(-\frac{\Delta t}{\tau_{i,1}+\tau_{i,2}}\right)\right\} \quad (5)$$

$$\phi_{i,2}(t) = \phi_{i,2}(t-\Delta t)\cdot \exp\left(-\frac{\Delta t}{\tau_{i,2}}\right) - \alpha_i \cdot \Delta T(t)\cdot \frac{\tau_{i,2}}{\tau_{i,1}}\left\{1-\exp\left(-\frac{\Delta t}{\tau_{i,2}}\right)\right\} \quad (6)$$

At time $t_0$ at which a magnification error $\phi(t_0)$ described by expression (2) is specified, the initial values of the recurrence relations are obtained in accordance with:

$$\phi_{i,1}(t_0)=0$$

$$\phi_{i,2}(t_0)=0 \quad (7)$$

where N, $\alpha_i$, $\tau_{i,1}$, and $\tau_{i,2}$ are prediction parameters for predicting a change in magnification error φ(t), that is, N is the degree of freedom of the prediction model, $\alpha_i$ is the sensitivity parameter of the saturation value of the change in magnification error to the temperature, $\tau_{i,1}$ is a first time constant parameter, and $\tau_{i,2}$ is a second time constant parameter.

When this is done, the prediction value φ(t) of the magnification error at arbitrary time t after time $t_0$ can be obtained.

The above-mentioned prediction parameters depend on the design conditions such as the internal structures, arrangements, and temperature control mechanisms of the heat generation sources and the projection optical system PO of the exposure apparatus 100. In this embodiment, the relationship between the temperature and magnification error of the projection optical system PO is obtained by actual measurement to determine prediction parameters, as will be described hereinafter.

First, data of a change in temperature of the temperature measurement portion of the projection optical system PO (to be simply referred to as temperature change data hereinafter) illustrated in FIG. 2A, and data of a change in magnification error of the projection optical system PO (to be simply referred to as magnification error change data hereinafter) illustrated in FIG. 2B are obtained. Practical examples of methods of obtaining temperature change data and magnification error change data will be described. A method of obtaining temperature change data illustrated in FIG. 2A will be exemplified first. First, the exposure apparatus 100 is kept stopped for a sufficiently long time so that its temperature stabilizes to a steady state value. Then, in the period from time $t_0$ to the end of the time interval TT, for example, the original positioning mechanism RP is activated to drive the original stage RS while light is not emitted by the light source LS. At this time, the measurement values (temperatures) obtained by the temperature measuring device TP at times after time $t_0$ are recorded in a memory (for example, a memory in the controller CT; not shown). This makes it possible to obtain temperature change data.

A method of obtaining magnification error change data illustrated in FIG. 2B will be exemplified next. First, the exposure apparatus 100 is kept stopped for a sufficiently long time so that its temperature stabilizes to a steady state value. Then, in the period from time $t_0$ to time t ($(t-t_0)$<TT), for example, the original positioning mechanism RP is activated to drive the original stage RS while light is not emitted by the light source LS. A magnification error of the projection optical system PO at time t is measured. This magnification error can be measured by, for example, transferring a test pattern onto a substrate by exposure to radiant energy, developing the transferred test pattern (or keeping the transferred test pattern intact as a latent image without development), and measuring the developed test pattern. The above-mentioned processing is performed a plurality of different times t, thereby obtaining magnification error change data in the period from time $t_0$ to time t ($(t-t_0)$<TT). The exposure apparatus 100 is kept stopped for a sufficiently long time so that its temperature stabilizes to a steady state value. Then, in the period from time $t_0$ to the end of the time interval TT, for example, the original positioning mechanism RP is activated to drive the original stage RS while light is not emitted by the light source LS. A magnification error of the projection optical system PO at subsequent time t ($(t-t_0)$>TT) is measured. The above-mentioned processing is performed a plurality of different times t, thereby obtaining magnification error change data in the period from time $t_0$ to time t ($(t-t_0)$<TT).

Upon the above-mentioned operation, temperature change data and magnification error change data are obtained. After temperature change data and magnification error change data are obtained, the prediction parameters $\alpha_i$, $\tau_{i,1}$ and $\tau_{1,2}$ are determined by a calculation process using, for example, the least-squares method so that the magnification error change data is approximated by the magnification error calculated based on the prediction model equation presented in expressions (4) to (6).

A solid line in FIG. 3 indicates the magnification error of the projection optical system PO predicted based on the temperature measured by the temperature measuring device TP, using a prediction model having the values of the prediction parameters $\alpha_i$, $\tau_{i,1}$, and $\tau_{1,2}$, which are determined by the above-mentioned method. In the example shown in FIG. 3, the prediction parameters have the following values.

N=2
$\alpha_1$=−62.8 [ppm/° C.]
$\alpha_2$=54.9 [ppm/° C.]
$\tau_{1,1}$=6,500 [sec]
$\tau_{2,1}$=1 [sec]
$\tau_{1,2}$=1 [sec]
$\tau_{2,2}$=2,200 [sec]

Referring to FIG. 3, points indicating the actual measurement result of the magnification error match a solid line indicating the magnification error calculated based on the prediction model. As can be seen from FIG. 3, a change in magnification error of the projection optical system PO can be predicted with high accuracy from the measurement result of the temperature of the projection optical system PO, based on the above-mentioned prediction model equation (second-order lag response function).

The value of the degree of freedom N of the prediction model, which is required to obtain a sufficient prediction accuracy, may depend on the design of the projection optical system, such as the number of optical elements which constitute the projection optical system. In many cases including the example given herein, it is desired to set N=2 to obtain a sufficient prediction accuracy in a projection optical system of a general exposure apparatus.

Figure 4:
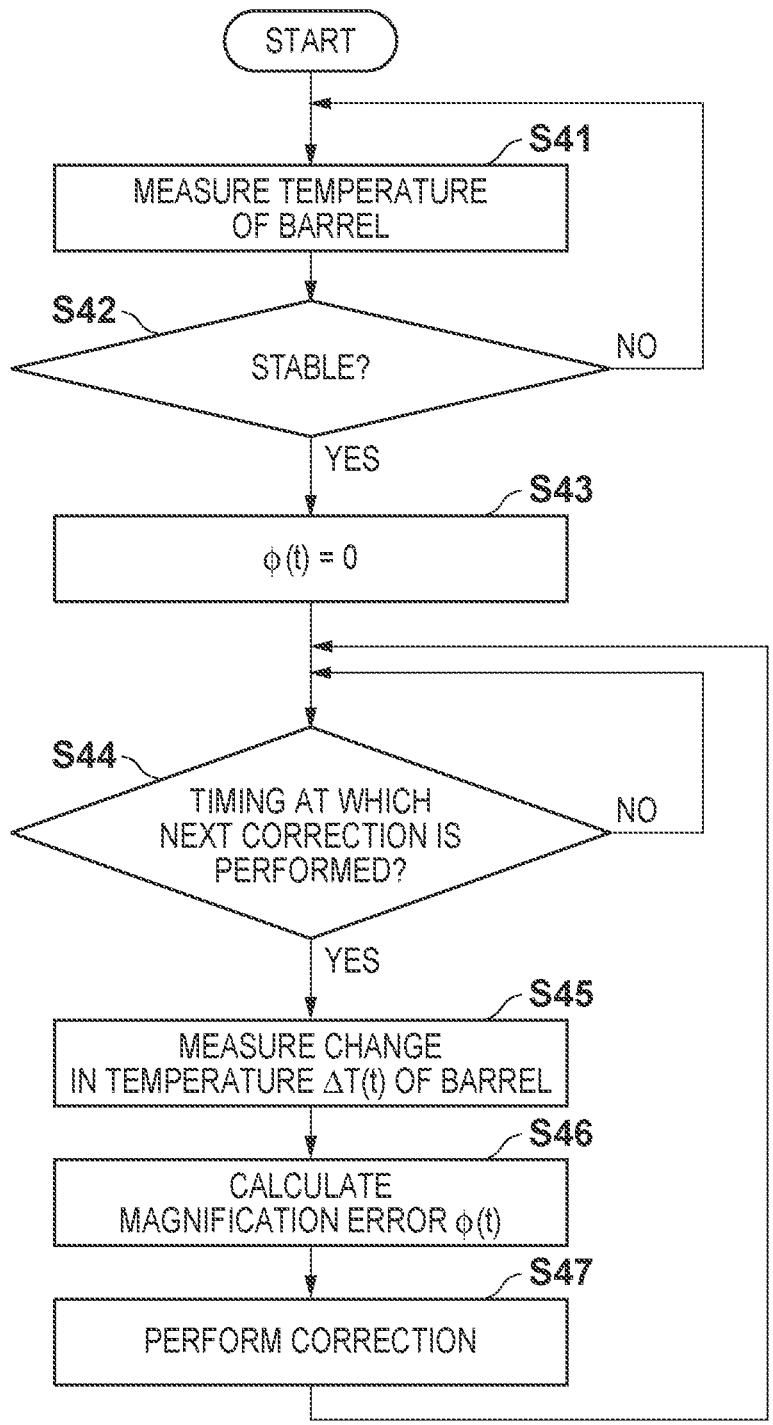
FIG. 4 is a flowchart illustrating the sequence of processing of predicting a change in optical characteristic of the projection optical system, and reducing a change in state of an image formed on a substrate due to the change in optical characteristic, based on the prediction result.

Processing of predicting a change in magnification error of the projection optical system PO using the above-mentioned prediction model (second-order lag response function), and reducing a change in state of an image formed on the substrate due to a change in optical characteristic, based on the prediction result, will be exemplified below with reference to FIG. 4. The controller CT performs this processing. Although the state of the image is the magnification of the image that changes depending on the projection magnification of the projection optical system PO (more specifically, the magnification of the image relative to the pattern of the original) in the following example, this state can more generally be that resulting from the aberration of the projection optical system PO.

First, the controller CT keeps the exposure apparatus 100 stopped for a sufficiently long time, and waits until the temperature of the projection optical system PO stabilizes to a steady state value. More specifically, the controller CT measures the temperature of the barrel of the projection optical system PO using the temperature measuring device TP in step S41, and determines in step S42 whether this temperature is stable at a steady state value. The controller CT repeats steps S41 and S42 until the temperature of the barrel of the projection optical system PO stabilizes to a steady state value.

When the temperature of the barrel of the projection optical system PO has stabilized, in step S43 the controller CT initializes time t to $t_0$ and sets the magnification error $\phi(t)$ at time $t_0$ to "0" as:

$$\phi(t_0)=0 \qquad (8)$$

In step S44, the controller CT waits until the time to perform correction comes, and advances the process to step S45 when this time comes. In this case, the processes in steps S45 to S47 are performed at the time interval $\Delta t$. In step S44 performed for the nth time, the time to perform correction is $(t_0+\Delta t \times n)$.

In step S45, the controller CT measures a change in temperature of the barrel of the projection optical system PO as the change in temperature $\Delta T(t)$ from the temperature at time $t_0$. In step S46, the controller CT calculates the magnification error $\phi(t)$ of the projection optical system PO.

More specifically, the controller CT calculates the prediction value $\phi(t)$ of the magnification error at time t in accordance with expressions (4), (5), and (6), based on the change in temperature $\Delta T(t)$ measured using the temperature measuring device TP, the known parameters $\alpha_i$, $\tau_{i,1}$, and $\tau_{i,2}$, and the prediction value $\phi(t-\Delta t)$ of the magnification error at time $\phi(t-\Delta t)$. Note that the prediction value $\phi(t-\Delta t)$ is given by:

$$\phi(t-\Delta t) = \sum_{i=1}^{2} (\phi_{i,1}(t-\Delta t) + \phi_{i,2}(t-\Delta t)) \qquad (9)$$

The prediction value $\phi(t-\Delta t)$ used in step S46 performed for the first time (when n=1) is the value of the magnification error $\phi(t)$ set in step S43, that is, "0". Also, the prediction value $\phi(t-\Delta t)$ of the magnification error used in step S46 performed for the nth time is the magnification error $\phi(t)$ calculated in step S46 performed for the (n−1)th time.

The time interval $\Delta t$ can be set to, for example, about 10 [sec]. The time interval $\Delta t$ must be a short time equal to or less than a predetermined ratio to the time constants of the prediction model (second-order lag response function). This is because when the time interval $\Delta t$ is long, correction of the magnification error cannot sufficiently follow a change in magnification error. It is desired to set a minimum value $\Delta t_{min}$ of the time interval $\Delta t$ to, for example, 0.3 times a maximum value $\tau_{max}$ of the time constant parameters or less. That is, the values $\Delta t_{min}$ and $\tau_{max}$ desirably satisfy $\Delta t_{min}/\tau_{max} \leq 0.3$.

In step S47, the controller CT performs processing of reducing a change in state of an image formed on the substrate W due to a change in magnification error of the projection optical system PO, based on the prediction value $\phi(t)$ of the magnification error calculated in step S46. More specifically, the controller CT operates the correction unit PE built into the projection optical system PO so as to reduce the magnification error $\phi(t)$ calculated in step S46. Note that the correction unit PE can correct the magnification of the projection optical system PO so as to reduce the magnification error $\phi(t)$ by driving a magnification correction optical element of the projection optical system PO. The correction unit PE can move the magnification correction optical element along the optical axis of the projection optical system PO using an actuator such as a pneumatic actuator, a piezoelectric element, or an ultrasonic motor. Note that instead of or in addition to driving an optical element of the projection optical system PO, the wavelength of light emitted by the light source LS may be changed to correct the magnification of the projection optical system PO so as to reduce the magnification error $\phi(t)$. If the focus position changes upon correction of the magnification of the projection optical system PO, at least one of the original stage RS and the substrate stage WS need only be moved so as to obtain a best focus state in accordance with the correction result.

Although the optical characteristic which changes with a change in temperature of the projection optical system PO is the projection magnification (magnification error) of the projection optical system PO in the foregoing description, the present invention is not limited to this. The optical characteristic which changes with a change in temperature of the projection optical system PO and is corrected by a second-order lag transfer model or a second-order lag response function may be at least one of, for example, focus, curvature of field, astigmatism, spherical aberration, and coma aberration. Note that when the optical characteristic to be corrected is focus, the focus may be corrected by adjusting the position of at least one of the original stage RS and the substrate stage WS in the optical axis direction of the projection optical system PO.

Although a change in temperature of the projection optical system PO results from heat generated by the original positioning mechanism RP in the foregoing description, the present invention is not limited to this. The factor of a change in temperature of the projection optical system PO may be, for example, heat generated by the substrate stage WS and a substrate stage mechanism which drives it or that generated by the light source LS, a control error of an air conditioner which controls the temperature in the exposure apparatus, or a combination thereof.

Figure 5:
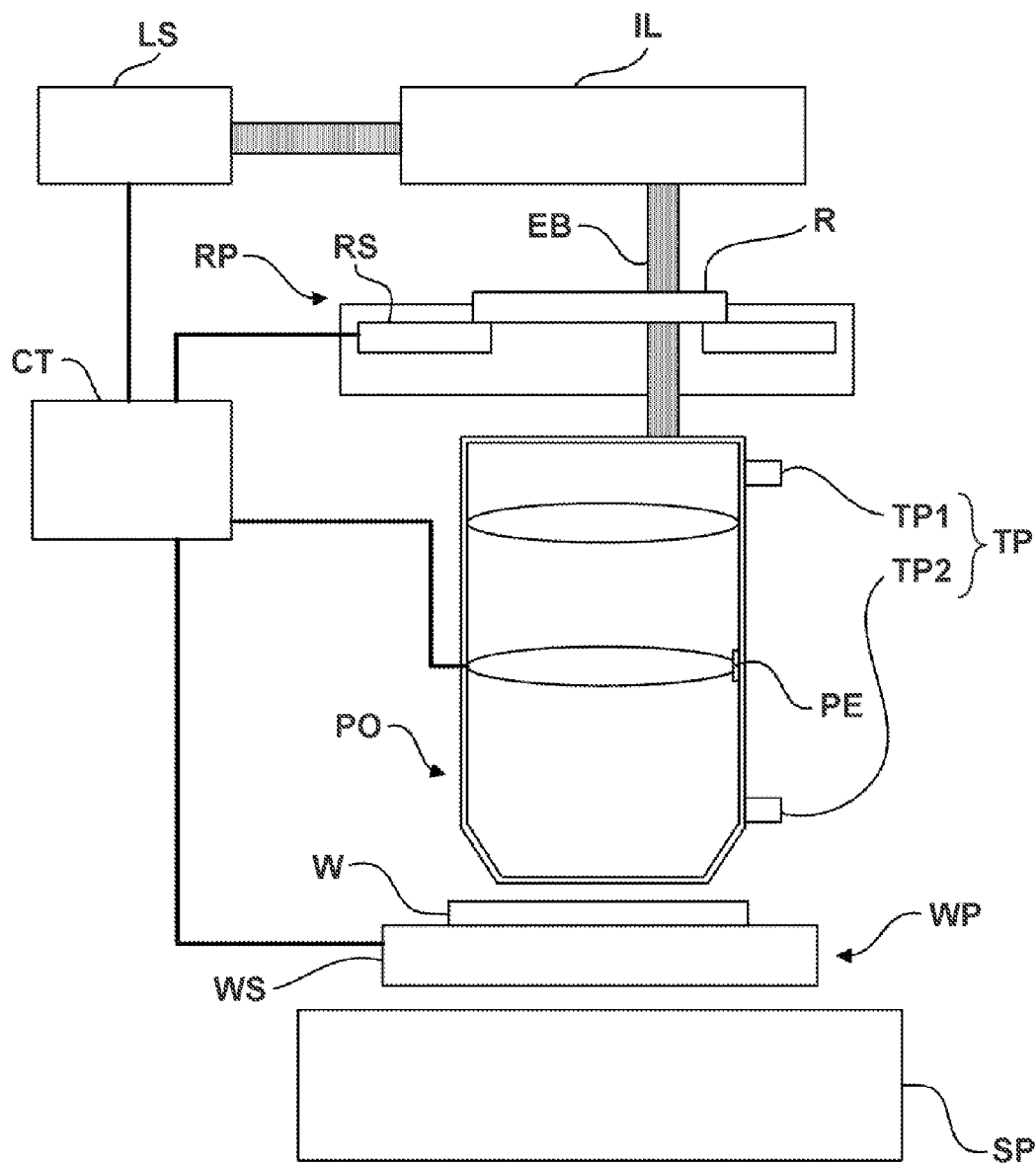
FIG. 5 is a diagram showing an exposure apparatus according to the second embodiment of the present invention.

An exposure apparatus according to the second embodiment of the present invention will be described next with reference to FIG. 5. Details that are not particularly referred to herein can be the same as in the first embodiment. An exposure apparatus 200 according to the second embodiment provides an example of a configuration which measures the temperature of a projection optical system PO using a plurality of thermometers. In the exposure apparatus 200 according to the second embodiment, a temperature measuring device TP includes a first thermometer TP1 and second thermometer TP2, as illustrated in FIG. 5. In the second embodiment, in place of expression (1), an expression (10) is used. The expression (10) describes a change in temperature ΔT(t) used to determine prediction parameters of a change in magnification error and predict the change in magnification error.

$$\Delta T(t) = T1(t) - T2(t) - T0 \quad (10)$$

$T1(t)$ and $T2(t)$ are the temperatures measured by the first thermometer TP1 and second thermometer TP2, respectively, at time t. According to the second embodiment, information indicating the temperature distribution of the projection optical system PO can be obtained by obtaining data measured by a plurality of thermometers. As described in the first embodiment, a change in temperature of the projection optical system PO occurs through heat conduction in the projection optical system PO. Hence, in the second embodiment, the inventor of the present invention conducted a closer examination of heat conduction in the projection optical system PO, grasped the cause of the heat conduction, and thereby devised a measure to improve the prediction accuracy of a change in magnification error.

Figure 6:
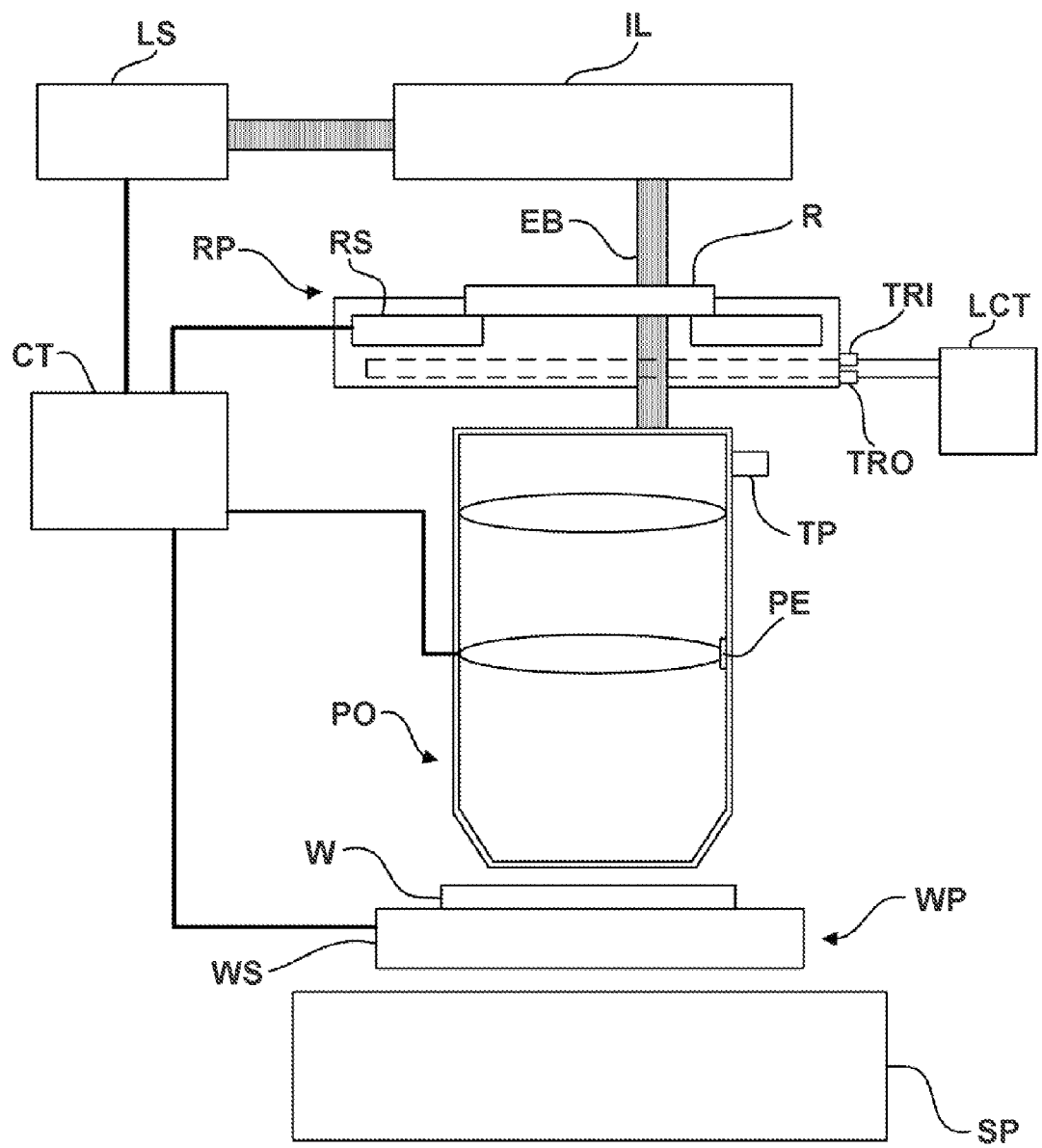
FIG. 6 is a diagram showing an exposure apparatus according to the third embodiment of the present invention.

An exposure apparatus according to the third embodiment of the present invention will be described next with reference to FIG. 6. Details that are not particularly referred to herein can be the same as in the first and/or second embodiment. When an exposure apparatus 300 serves as a scanning exposure apparatus, an original stage RS is scanned (moved) at high speed upon an exposure operation, so an original positioning mechanism RP generates a large amount of heat. Therefore, the original positioning mechanism RP is equipped with a coolant pipe LUR for controlling its temperature to an almost constant value, and a temperature-controlled coolant passes through the coolant pipe LUR. This coolant has its temperature controlled by a coolant controller LCT and is supplied to the coolant pipe LUR. The exposure apparatus 300 includes thermometers TRI and TRO which measure the temperature of the coolant flowing through the coolant pipe LUR. The thermometer TRI is arranged so as to measure the temperature of the coolant flowing into the original positioning mechanism RP. The thermometer TRO is arranged so as to measure the temperature of the coolant flowing out of the original positioning mechanism RP. The coolant controller LCT controls the temperature of the coolant based on the temperature values measured by the thermometers TRO and TRI, so that the temperature of the original positioning mechanism RP reaches a target value.

Heat transferred from the original positioning mechanism RP to a projection optical system PO is suppressed to a certain degree by the above-mentioned temperature control. However, if, for example, the driving speed of the original stage RS is very high, the heat cannot be perfectly suppressed. A controller CT can predict a leakage heat quantity J(t) (t: time), transferred from the original positioning mechanism RP to the projection optical system PO, by referring to, for example, power information for driving the original stage RS and information of the energy use efficiency design value of a driving motor of the original stage RS. Also, the controller CT can more precisely predict the leakage heat quantity J(t) by referring to information of the measurement values which are generated by the thermometer TRO and TRI and obtained by the coolant controller LCT.

The leakage heat quantity J(t) is transferred to the projection optical system PO and changes a magnification error φ(t). The relationship between the leakage heat quantity J(t) and the magnification error φ(t) can be described by:

$$\phi(t) = \sum_{i=1}^{N} (\phi_{i,1}(t) + \phi_{i,2}(t)) \quad (11)$$

$$\phi_{i,1}(t) = \phi_{i,1}(t - \Delta t) \cdot \exp\left(-\frac{\Delta t}{\tau_{i,1} + \tau_{i,2}}\right) + \gamma_i \cdot J(t) \cdot \frac{\tau_{i,1} + \tau_{i,2}}{\tau_{i,1}} \left\{1 - \exp\left(-\frac{\Delta t}{\tau_{i,1} + \tau_{i,2}}\right)\right\} \quad (12)$$

$$\phi_{i,2}(t) = \phi_{i,2}(t - \Delta t) \cdot \exp\left(-\frac{\Delta t}{\tau_{i,2}}\right) - \gamma_i \cdot J(t) \cdot \frac{\tau_{i,2}}{\tau_{i,1}} \left\{1 - \exp\left(-\frac{\Delta t}{\tau_{i,2}}\right)\right\} \quad (13)$$

where $\gamma_i$, $\tau_{i,1}$, and $\tau_{i,2}$ are prediction parameters for predicting a change in magnification error φ(t), that is, $\gamma_i$ is the sensitivity parameter of the saturation value of the change in magnification error to the leakage heat quantity, $\tau_{i,1}$ is a first time constant parameter, and $\tau_{i,2}$ is a second time constant parameter.

The above-mentioned prediction parameters $\gamma_i$, $\tau_{i,1}$, and $\tau_{i,2}$ can be determined by the same prediction parameter determination process as in the method described in the first embodiment. A change in magnification error can be predicted and corrected using the above-mentioned model equation having these prediction parameters. Details of methods of predicting and correcting a change in magnification error can be the same as those described in the first embodiment.

Processing of predicting a change in optical characteristic of the projection optical system PO based on a heat quantity transferred from the original positioning mechanism RP to the projection optical system PO, and reducing a change in state of an image formed on a substrate W due to the change in optical characteristic, based on the prediction result, has been described above. Similarly, it is also possible to predict a change in optical characteristic of the projection optical system PO based on a heat quantity transferred from a substrate positioning mechanism WP to the projection optical system PO, and reduce a change in state of an image formed on the substrate W due to the change in optical characteristic, based on the prediction result. Further, these methods may be used in combination. That is, processing of predicting a change in optical characteristic of the projection optical system based on a heat quantity transferred from at least one of the original positioning mechanism and the substrate positioning mechanism to the projection optical system, and reducing a change in state of an image formed on the substrate due to the change in optical characteristic, based on the prediction result, can be performed.

In this embodiment, the optical characteristic of the projection optical system PO, which undergoes a change to be predicted and corrected, is not limited to the magnification error, and may be the focus error, curvature of field, astigmatism, spherical aberration, or coma aberration.

A method of manufacturing a device (for example, a semiconductor device or a liquid crystal display device) according to an embodiment of the present invention will be described next. A semiconductor device is manufactured by a preprocess of forming an integrated circuit on a substrate, and a post-process of completing, as a product, a chip of the integrated circuit formed on the substrate by the preprocess. The preprocess includes a step of exposing a substrate coated with a photosensitive agent to radiant energy using the exposure apparatus mentioned in any one of the first to third embodiments of the present invention, and a step of developing the substrate. The post-process includes an assembly step (dicing and bonding) and packaging step (encapsulation). A liquid crystal display device is manufactured by a step of forming a transparent electrode. The step of forming a transparent electrode includes a step of coating a photosensitive agent on a glass substrate on which a transparent conductive film is deposited, a step of exposing the glass substrate coated with the photosensitive agent to radiant energy using the abovementioned exposure apparatus, and a step of developing the glass substrate. The method of manufacturing a device according to this embodiment can manufacture a device with a quality higher than those of devices manufactured by the related art techniques.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-114106, filed May 20, 2011, which is hereby incorporated by reference herein in its entirety.

What is claimed is:

1. An exposure apparatus which includes a projection optical system and exposes a substrate to radiant energy via the projection optical system, the exposure apparatus comprising:
a temperature measuring device configured to perform measurement of a temperature of a temperature measurement portion of a barrel of the projection optical system; and
a controller configured to perform prediction of a change in an optical characteristic of the projection optical system based on a change in temperature measured by the temperature measuring device, and to perform processing of reduction, based on the prediction, of a change in a state of an image formed on the substrate by the projection optical system,
wherein the controller is configured to perform the prediction in accordance with a second-order lag response function of the change in the measured temperature of the temperature measurement portion, by repeatedly calculating, at a time interval $\Delta t$, the optical characteristic of the projection optical system based on the change in temperature $\Delta T(t)$ from temperature at time $t_0$, as measured by the temperature measuring device, and the optical characteristic calculated at time $t-\Delta t$, where $t=t_0+\Delta t \times n$, and where n is a number of times the optical characteristic is to be calculated.

2. The apparatus according to claim 1, wherein a minimum value $\Delta t min$ of a time interval at which the measurement and the prediction are performed, and a maximum value $\tau max$ of a time constant in the second-order lag response function satisfy $\Delta t min/\tau max \leq 0.3$.

3. The apparatus according to claim 1, wherein the temperature measuring device is configured to measure temperatures of a plurality of temperature measurement portions of the barrel.

4. The apparatus according to claim 1, wherein the second-order lag response function is determined based on an actual measurement of a relationship between the change in temperature of the temperature measurement portion and the change in optical characteristic of the projection optical system.

5. The apparatus according to claim 4, further comprising:
a light source configured to emit and irradiate the radiant energy to an original and expose the substrate to the radiant energy via the projection optical system; and
an original positioning mechanism configured to position the original,
wherein the temperature measuring device provides the actual measurement by measuring the change in temperature of the temperature measurement portion while the original positioning mechanism is activated and the light source is not activated.

6. The apparatus according to claim 5, wherein:
the temperature measurement portion is part of an outer surface of the barrel of the projection optical system, and
a temperature gradient is generated in the projection optical system by heat, generated by the original positioning mechanism, transferring to the outer surface of the barrel, and the heat is transferred to an optical element in the projection optical system due to the temperature gradient so that the change in the optical characteristic of the projection optical system is caused to generate the change in the state of the image formed on the substrate.

7. The apparatus according to claim 1, further comprising:
a driving unit configured to drive an optical element of the projection optical system,
wherein the controller is configured to control the driving unit to reduce the change in the state of the image.

8. The apparatus according to claim 1, wherein the optical characteristic includes a projection magnification of the projection optical system.

9. An exposure apparatus which includes a projection optical system and an original positioning mechanism configured to position an original or a substrate positioning mechanism configured to position a substrate or both thereof, and exposes the substrate to radiant energy via the projection optical system, the exposure apparatus comprising:
a controller configured to perform prediction of a change in an optical characteristic of the projection optical system based on a heat quantity transferred from the original positioning mechanism or the substrate positioning mechanism or both thereof to the projection optical system, and to perform processing of reduction, based on the prediction, of a change in a state of an image formed on the substrate by the projection optical system,
wherein the controller is configured to perform the prediction in accordance with a second-order lag response function of the heat quantity, by repeatedly calculating, at a time interval $\Delta t$, the optical characteristic of the projection optical system based on the change in the heat quantity transferred to the projection optical system during a period from time $t_0$ to time t, and the optical characteristic calculated at time $t-\Delta t$, where $t=t_0+\Delta t \times n$, and where n is a number of times the optical characteristic is to be calculated.

10. The apparatus according to claim 9, wherein the second-order lag response function is determined based on an actual measurement of a relationship between the heat quantity and the change in the optical characteristic of the projection optical system.

11. The apparatus according to claim 9, wherein:
the original positioning mechanism includes an original stage configured to hold the original, and
the controller is configured to predict the heat quantity based on information for the original positioning mechanism to drive the original stage.

12. The apparatus according to claim 9, further comprising:
a coolant controller configured to control a temperature of the original positioning mechanism,
wherein the controller is configured to predict the heat quantity based on information from the coolant controller.

13. A method of manufacturing a device, the method comprising the steps of:
exposing a substrate to radiant energy using an exposure apparatus which includes a projection optical system and exposes the substrate to radiant energy via the projection optical system; and
developing the exposed substrate; and
processing the developed substrate to manufacture the device,
wherein the exposure apparatus comprises:
a temperature measuring device configured to perform measurement of a temperature of a temperature measurement portion of a barrel of the projection optical system; and
a controller configured to perform prediction of a change in an optical characteristic of the projection optical system based on a change in temperature measured by the temperature measuring device, and to perform processing of reduction, based on the prediction, of a change in a state of an image formed on the substrate by the projection optical system,
wherein the controller is configured to perform the prediction in accordance with a second-order lag response function of the change in the measured temperature of the temperature measurement portion, by repeatedly calculating, at a time interval $\Delta t$, the optical characteristic of the projection optical system based on the change in temperature $\Delta T(t)$ from temperature at time $t_0$, as measured by the temperature measuring device, and the optical characteristic calculated at time $t-\Delta t$, where $t=t_0+\Delta t \times n$, and where n is a number of times the optical characteristic is to be calculated.

14. A method of manufacturing a device, the method comprising the steps of:
exposing a substrate to radiant energy using an exposure apparatus which includes a projection optical system and an original positioning mechanism configured to position an original or a substrate positioning mechanism configured to position a substrate or both thereof, and exposes the substrate to radiant energy via the projection optical system;
developing the exposed substrate; and
processing the developed substrate to manufacture the device,
wherein the exposure apparatus comprises:
a controller configured to perform prediction of a change in an optical characteristic of the projection optical system based on a heat quantity transferred from the original positioning mechanism or the substrate positioning mechanism or both thereof to the projection optical system, and to perform processing of reduction, based on the prediction, of a change in a state of an image formed on the substrate by the projection optical system,
wherein the controller is configured to perform the prediction in accordance with a second-order lag response function of the heat quantity, by repeatedly calculating, at a time interval $\Delta t$, the optical characteristic of the projection optical system based on the change in the heat quantity transferred to the projection optical system during a period from time $t_0$ to time t, and the optical characteristic calculated at time $t-\Delta t$, where $t=t_0+\Delta t \times n$, and where n is a number of times the optical characteristic is to be calculated.

* * * * *